United States Patent
Bigo et al.

(10) Patent No.: US 6,441,939 B1
(45) Date of Patent: Aug. 27, 2002

(54) DEVICE AND METHOD FOR REGENERATING A TRAIN OF SOLITONS

(75) Inventors: Sébastien Bigo, Palaiseau (FR); Thomas Ducellier, Ottawa (CA)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/403,622

(22) PCT Filed: May 7, 1998

(86) PCT No.: PCT/FR98/00926
§ 371 (c)(1),
(2), (4) Date: Jan. 10, 2000

(87) PCT Pub. No.: WO98/50824
PCT Pub. Date: Nov. 12, 1998

(30) Foreign Application Priority Data

May 7, 1997 (FR) .......................................... 97 05637

(51) Int. Cl.⁷ .............................................. H04B 10/16
(52) U.S. Cl. ....................................... 359/179; 359/176
(58) Field of Search ................................ 385/5, 14, 27, 385/122; 359/158, 176, 173, 179

(56) References Cited

U.S. PATENT DOCUMENTS 5,757,529 A  *  5/1998  Desurvire et al. ........... 359/179
5,848,205 A  *  12/1998  Bigo ............................ 385/15

OTHER PUBLICATIONS

S. Bigo et al, "Analysis of soliton in–line regeneration through two–wavelength nonlinear loop mirror as synchronous amplitude/phase modulator", Electronics Letters, Dec. 7, 1995, UK, vol. 31, No. 25, ISSN 0013–5194, pp. 2191–2192, XP002052734.

M. Eiselt et al, "Slalom: Semiconductor Laser Amplifier in a Loop Mirror", Journal of Lightwave Technology, vol. 13, No. 10, Oct. 1995, pp. 2099–2112, XP000604371.

M. G. Kane et al, "Asymmetric Optical Loop Mirror: Analysis of an All–Optical Switch", Applied Optics, vol. 33, No. 29, Oct. 10, 1994, pp. 6833–6842, XP000473152.

O. G. Okhotnikov et al, "Pulse Generation Through Optical Switching in Phase Driven Loop Mirror", Electronics Letters, vol. 31, No. 25, Dec. 7, 1995, pp. 2197/2198 XP000546813.

P–L Francois et al, "Reduction of averaged soliton interaction forces by amplitude modulation", Optics Letters, Apr. 15, 1993, vol. 18, No. 8, ISSN 0146–9592, pp. 583–585, XP00205735.

* cited by examiner

Primary Examiner—Jason Chan
Assistant Examiner—Christina Y. Leung
(74) Attorney, Agent, or Firm—Sughrue Mion, PLLC

(57) ABSTRACT

In the invention, a stream (S) of solitons enters a Sagnac interferometer (6) with an offset semiconductor amplifier (A) and the amplifier is controlled by an optical synchronization signal (Y) that is amplitude-modulated at a frequency which is half a bit frequency of the stream, the offset of the amplifier in said interferometer and the parameters of said synchronization signal being given values such that two adjacent solitons of said train are transmitted with their optical phase relationship inverted. The invention finds an application in fiber optic telecommunications networks.

7 Claims, 1 Drawing Sheet

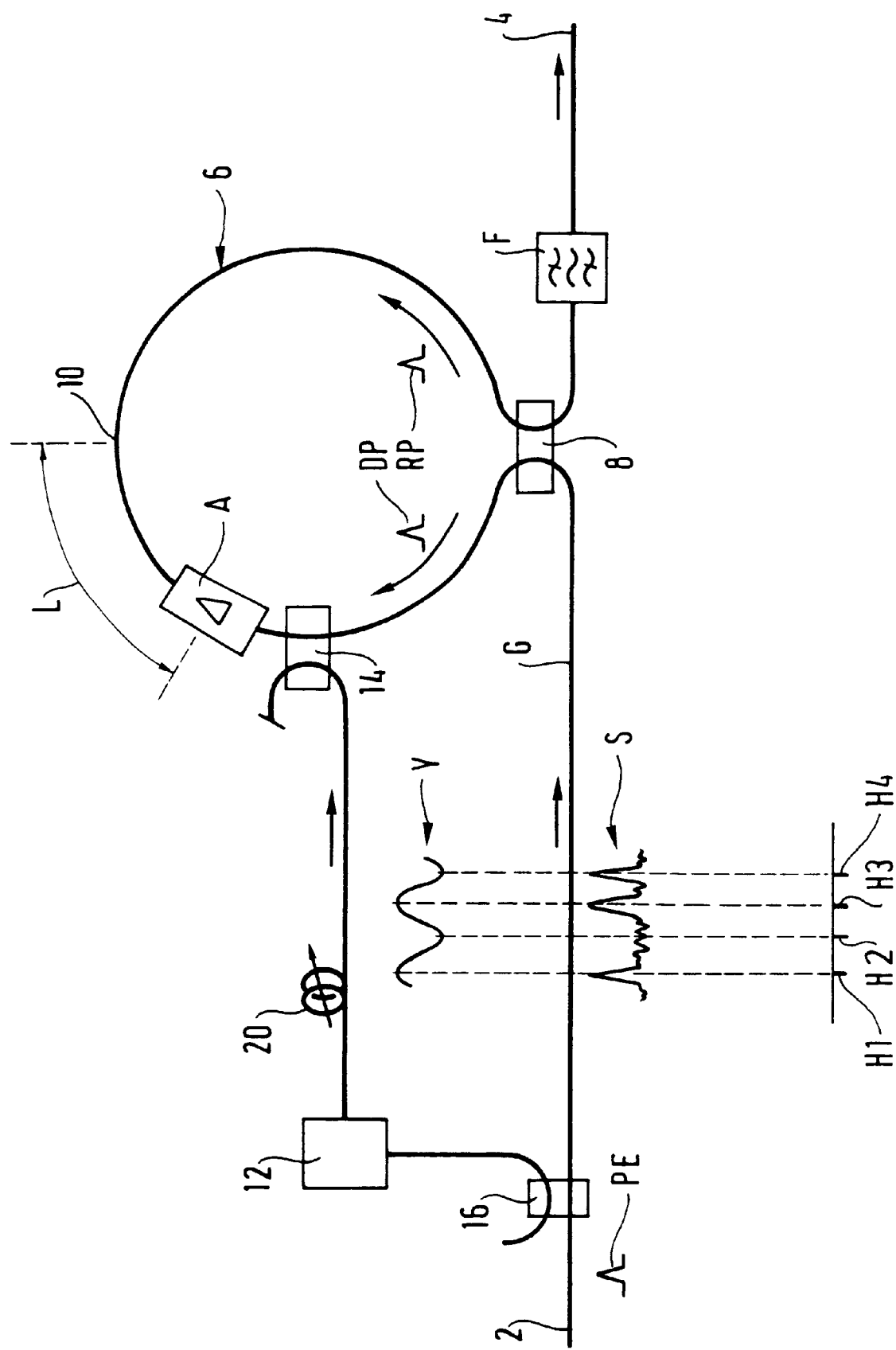

DEVICE AND METHOD FOR REGENERATING A TRAIN OF SOLITONS

BACKGROUND OF THE INVENTION

The present invention concerns a system for regenerating a stream of solitons and finds an application in telecommunications networks.

Conveying data to be transmitted over long-haul telecommunications links in a stream of optical pulses is well known. A stream of this kind is timed, meaning that clock times are defined in regular sequence at a predetermined frequency constituting a "bit frequency", the data to be transmitted being conveyed in binary form by the presence or absence of a pulse at each successive clock time. It is well known that the pulses can advantageously be launched into the fibers that waveguide them in the form of solitons. It is well known that a soliton is matched to the fiber which guides it and is then characterized by a specific amplitude time profile, a very short duration at half-height, and high spectral purity. Because chromatic dispersion and non-linearity effects (Kerr effect) specific to the fiber are compensated, a soliton has the advantage of propagating in the fiber without cumulative deformation, at least theoretically. However, the compensation requires that the average power of the pulse be maintained as it propagates, but power losses are inevitable and must therefore be compensated by means of a succession of optical amplifiers along the link. The amplifiers are typically optically pumped erbium-doped fibers. This need to compensate power losses of the pulses gives rise to two unwanted phenomena associated with spontaneous emission in the amplifiers: one is Gordon-Haus jitter, which consists in each soliton within the stream of solitons being displaced randomly on either side of the corresponding clock time. The other is accumulated noise. These two unwanted phenomena can degrade quality, in other words they can increase transmission error rate.

One prior art method for avoiding those drawbacks consists in synchronously modulating an optical pulse stream, more especially a stream of solitons. The modulation regenerates the stream of solitons. It restores the correct time profile and position of the solitons and eliminates or at least reduces noise. The theory of the method is described in an article by H. Kubota and Nakazawa, "Soliton transmission control in time and frequency domains", IEEE J. Quantum Electronics v. 29, no. 7, pp. 2189–2197, July 1993. A 10 Gbit/s transmission experiment over one million kilometers is described in an article by Nakazawa et al. (1991), "Experimental demonstration of soliton data transmission over unlimited distance with soliton control in time and frequency domains", Electronics Letters, v. 29, no. 9, pp. 729–730, Apr. 29, 1993.

A system for regenerating a stream of light pulses is described in an article by J. K. Lucek and K. Smith (1993) "All optical signal regenerator", Opt. Lett. V. 18, no. 15, pp. 1226–1228, Aug. 1, 1993. Also worthy of mention is a communication by D. Sandel et al.: "Polarization-independent regenerator with nonlinear optoelectronic phase-locked loop", Optical Fiber Conference Proceedings 1994, page FG2.

An article by M. Eiselt, W. Piper and H. G. Weber "SLALOM: Semiconductor Laser Amplifier in a Loop Mirror", Journal of Lightwave Technology, vol. 13, no. 10, October 1995, pp. 2099–2112 describes a so-called SLA-LOM device. It indicates in particular that the device can be used for synchronous regeneration, as described in the section entitled: "SLALOM as Optical Retiming Device". It does not specifically describe the essential components of a regenerator, i.e. a regeneration system, but rather those of an experimental system for assessing the possibilities of a regenerator. A regenerator as described in the above article is referred to hereinafter as a "prior art SLALOM regenerator".

Some of the essential features of a prior art regenerator of the above kind have analogies with features of a system of the present invention. These features are:

An optical waveguide between an input for receiving a data signal consisting of a stream of pulses to be regenerated and an output at which a stream of regenerated pulses carrying the same data is supplied. The pulses of the stream to be regenerated have an input wavelength. The stream has a clock rate defining successive clock times at a bit frequency. A segment of this waveguide constitutes an interferometer loop. The loop is closed by a loop coupler which couples the waveguide to itself at both ends of the loop to constitute a Sagnac interferometer.

A loop amplifier consisting of a semiconductor laser amplifier connected in series into the interferometer loop at a distance from the mid-point of the loop. This distance along the waveguide is referred to hereinafter as the "offset distance".

Finally, a clock source which supplies an optical signal defining clock times corresponding to the stream of pulses to be regenerated. The signal is injected into the interferometer loop to bring about therein cross modulation between it and the pulses of the stream. Its wavelength is referred to as the clock wavelength.

In the prior art SLALOM regenerator, the clock source supplies the signal mentioned above in the form of clock pulses. The pulses are supplied to the input of the waveguide of the interferometer loop. The loop coupler derives components from the data signal pulses and the clock pulses. They circulate in the interferometer loop in two opposite directions. Those derived from the data signal cause temporary saturation of the loop amplifier. The offset distance mentioned above is chosen so that the pulses derived from the clock pulses reach the amplifier when it is in a saturated state or a non-saturated state depending on their time position relative to the previous pulses. If both components derived from a clock pulse reach the amplifier in two different saturation states, they interfere positively in the loop coupler and the clock pulse is therefore transmitted to the output of the waveguide of the interferometer loop. This situation arises if the data signal includes a pulse in a suitable time position relative to the clock pulse, i.e. if the data signal has opened a time window for the clock pulse. The system therefore behaves like a gate controlled by the data signal. In this way the data is transferred to the pulse stream consisting of the clock pulses transmitted to the output of the waveguide. The new data signal is therefore supplied at the clock wavelength.

It would also appear that in the above prior art regenerator the offset distance is defined as a function of the duration of the loop amplifier saturation state caused by each pulse of the signal initially carrying the data. This distance is therefore defined as a function of the lifetime of charge carriers in the amplifier.

The prior art SLALOM regenerator has the advantage of being of the "all-optical" kind, which avoids bandwidth limitations associated with the use of electronic signals. It would appear to have various other advantages compared to prior art modulators of other all-optical types. These advantages are in particular that its interferometer loop is much shorter than those of NOLM type systems and it does not require the use of polarization-maintaining fibers if the loop comprises an optical fiber and the modulator must be insensitive to polarization. These advantages are important because it is sometimes highly desirable to implement the modulator in integrated form and because an optical signal has random polarization when it travels great distances along a fiber optic link. However, the prior art SLALOM regenerator seems to have the particular disadvantage that its operation appears to be highly dependent on operating parameters that define the duration of the loop amplifier saturation state. Moreover, if it were applied to regenerating a stream of solitons, the synchronization signal would itself have to be in the form of a stream of solitons which could be described as "clock solitons". Finally, it is necessary to allow for the fact that the wavelength of the new data signal is different from that of the signal received at the input. This would be a serious drawback in many applications.

SUMMARY OF THE INVENTION

The present invention has the following objects:

to make a SLALOM regenerator relatively insensitive to variations in the operating parameters of the semiconductor loop amplifier of the regenerator, to retain the original optical wavelength of the data is signal, more generally, to retain the advantages of the prior art SLALOM regenerator but avoid its disadvantages, and to minimize the error rate of a fiber optic transmission system in which data is carried by streams of solitons.

With these objects in view, a system in accordance with the invention is characterized in particular in that the offset distance of the loop amplifier of the system is not less than a minimum value equal to 20% of a nominal offset LN such that $$LN=c/2B$$

The offset distance also differs by at least this minimum value of the offset distance from illegal values equal to the product of the nominal offset multiplied by an even integer, c being the speed of light in said waveguide and B being the bit frequency defined by said clock rate of the stream of solitons. The signal representative of the clock times of the data signal is a synchronization signal whose optical envelope has a frequency equal to half the bit frequency. Finally, the amplitude and the phase of the envelope of the synchronization signal and an average value of the power of the signal are such that two solitons reaching the input of the system and occupying two immediately successive clock times in a stream of solitons are transmitted to the output of the system in optical antiphase.

BRIEF DESCRIPTION OF THE DRAWINGS

How the present invention can be put into effect is described hereinafter by way of non-limiting example and with the aid of the accompanying diagrammatic drawing.

The drawing shows a system in accordance with the invention.

DETAILED DESCRIPTION OF THE INVENTION

The system comprises the following essential components:

A light waveguide G extends between an input 2 for receiving a string S of solitons to be regenerated and an output 4 at which a stream of regenerated solitons is supplied. The waveguide may be an optical fiber or it may be formed on a substrate if the system is implemented in integrated form. The wavelength of the solitons constitutes an input wavelength. The stream has a clock rate defining successive clock times at a bit frequency. A segment of the waveguide constitutes an interferometer loop 6. The loop is closed by a loop coupler 8 coupling the waveguide to itself at both ends of the loop to constitute a Sagnac interferometer. The operation of an interferometer of this kind is well known in itself, and in outline it is as follows: If an input light pulse PE is received at the input 2, the coupler 8 splits it into two components DP and RP propagating in the loop in two opposite directions. The coupler then applies a first phase-shift of $\pi/2$ to the component RP relative to the pulse PE. When this component has completed the loop, the coupler applies a second phase-shift of $\pi/2$ thereto before transmitting it to the output 4, where it interferes with the component DP that propagated in the waveguide without being subjected to any phase-shift in the coupler 8. The interference is constructive or destructive depending on any other phase-shifts to which these components have been subjected in their respective circuits of the loop 6. To be more precise, the constructive or destructive nature of the interference results from the difference between two respective total values of these other phase-shifts for the two components concerned. As a result, the pulse PE is transmitted or not to the output 4 according to the value of a signal controlling that difference.

A semiconductor laser loop amplifier A is connected in series into the interferometer loop at a particular distance from a mid-point 10 of the loop. The mid-point is the point at the same distance from both ends of the loop. The distance L along the waveguide between the loop amplifier and the mid-point constitutes the "offset distance". According to the present invention, the offset distance L is at least equal to the above-defined minimum value and differs from said illegal values by at least this minimum value.

Finally, a synchronization source 12 supplies an optical synchronization signal Y which has a synchronization wavelength and whose power varies with time in a manner that defines the clock times H1 . . . H4 of the stream S of solitons. The synchronization signal Y is injected into the loop amplifier A, where it brings about cross modulation between the solitons and the signal, by a wavelength-selective synchronization coupler 14.

According to the invention, the optical envelope of the synchronization signal has a frequency equal to half the bit frequency of the stream of solitons to be regenerated. Moreover, the amplitude and the phase of the envelope and an average value of the power of the signal are such that two solitons reaching the input 2 and occupying two immediately successive clock times in the stream S of solitons (such as H3 and H4) are transmitted to the output 4 with their optical phase relationship inverted, i.e. the two solitons are transmitted in antiphase if they were in phase at the input of the system.

This antiphase relationship of two successive optical pulses is referred to in an article by O. G. Okhotnikov and F. M. Araujo, "Pulse generation through optical switching in phase driven loop mirror", Electronics Letters 7$^{th}$ December 1995 Vol. 31 No. 25. The article describes an optical pulse generator using an interferometer loop constituting a Sagnac interferometer. The amplifier of the loop is in an offset position and is controlled by an electrical signal whose frequency is half the repetition frequency of the pulses generated. The pulses are alternately bright pulses and dark pulses because of the alternation of their optical phases. The offset distances referred to are different from those of the present invention.

In the context of the present invention, the successive solitons could be referred to "adjacent solitons". Their optical antiphase relationship has the advantage of greatly limiting the risk of transmission quality being degraded by soliton collision phenomena. This advantage of an antiphase relationship between adjacent solitons is disclosed in an article by Pierre-Luc Francois and Thierry Georges, entitled "Reduction of averaged soliton interaction forces by amplitude modulation", Optics Letters, Apr. 15, 1993, Vol. 18, No. 8, pp. 583–585.

It exists independently of time jitter or noise in the stream of solitons to be regenerated, with the result that the system of the invention can be used with advantage even if the stream of solitons to be regenerated is not affected by jitter or noise. This advantage is not lost after a second stage of synchronous regeneration, which is contrary to what might be expected from a superficial analysis.

The new features (i.e. the offset distance and the frequency of the envelope of the synchronization signal) not only achieve effective synchronous regeneration but also yield the advantage resulting from the antiphase relationship of adjacent solitons. The present invention teaches that, when the new features are used, there are values of the amplitude, phase, and average power of the synchronization signal such that the antiphase relationship is obtained. These latter values will be apparent to the skilled person, on the basis of the above disclosure, and in particular on the basis of the previously mentioned article describing the SLALOM devices, over and above which no more than standard trial and error is required.

In the context of this invention, the peak-to-peak amplitude of the synchronization signal is much greater than what would be necessary for an input light pulse having the input wavelength and received at the input 2, in order to be transmitted or not transmitted to the output 4 depending on the time relationship between that light pulse and the modulation of the synchronization signal. This argument can be refined by considering the phase difference induced in the loop amplifier A between two components DP and RP of the same light pulse, the two components traveling round the interferometer loop in a forward direction and a retrograde direction, respectively. The phase difference is related to the variation in the power of the synchronization signal between the two times at which the respective components pass through the amplifier, or at least between two periods respectively preceding these two times, the duration of the two periods being defined by the lifetime of the charge carriers in the amplifier.

In the context of this invention, the values of the phase difference corresponding to two successive clock times are substantially symmetrical about the value corresponding to a median time between the two clock times. For the system to achieve synchronous regeneration of the solitons, the value of the phase difference corresponding to a median time must prevent an input pulse from being transmitted to the output of the system. As a result the amplitude of the modulation of the synchronization signal is such that the difference between the extreme values of the phase difference is substantially twice the difference that would enable the light pulse in question to be transmitted or eliminated, depending on its time relationship with the synchronization signal.

The phase variations that can be obtained in prior art amplifiers suitable for use as the loop amplifier are limited in practice, in particular when the power of the synchronization signal causing the variations is itself limited. This is why, in the context of this invention, it is desirable for the offset distance to have at least approximately optimum values enabling the objects of the invention to be achieved with the smallest possible values for the phase variations. This is why the offset distance L is preferably in the range from 80% to 120% of said nominal offset LN, possibly increased by the product of the nominal offset by an even integer. This can be expressed in the form $$0.8 < L/LN - 2k < 1.2$$

where k is an integer. Optimum offset values L are approximately given by the expression: $(2k+1)$ LN. The illegal values for this distance are given by the expression: $2k.LN$. These illegal values are those for which the system could not operate regardless of the characteristics of the loop amplifier and the synchronization signal. The expressions giving these optimum illegal values become exact in the situation where the modulation of the synchronization signal causes the variation of the phase-shift introduced by the loop amplifier to be sinusoidal.

In one typical embodiment the modulation of the synchronization signal Y is substantially sinusoidal.

The system preferably further includes a wavelength filter F for selectively transmitting to the output 4 light at the input wavelength.

The synchronization source 12 is preferably controlled by the steam S of solitons by way of a clock recovery coupler 16 and a waveguide 18 that constitute a clock recovery unit. This unit is provided with phase matching means 20 to impart to the synchronization signal a phase suitable for the stream of solitons.

The synchronization source 12 can include a clock recovery system similar to that described in an article by S. Kawanishi and M. Saruwatari, entitled "New-type phase-locked loop using traveling-wave laser-diode optical amplifier for very high-speed optical transmission", Electronics Letters $10^{th}$ November 1988 Vo.24 No. 23, pp. 1452–1453. It can also include a system for imparting a sinusoidal shape and the required frequency to the optical envelope of the signal obtained by clock recovery. This latter system can be similar to that described in an article by N. Onodera entitled "THz optical beat frequency generation by modelocked semiconductor lasers", Electronics Letters May 23, 1966 Vol. 32 No. 11, pp. 1013–1014.

To give a numerical example, the bit frequency b can be in the order 5 Ghz, the interferometer loop length can be in the range from 5 cm to 100 m, approximately, for example around 5 m, and the time offset induced by the offset distance between the times at which the two components of a pulse reach the loop amplifier can be given by the expression $2nL/c=35$ ps, for example, n being the refractive index seen by these components in the fiber constituting the interferometer loop.

What is claimed is:

1. A system for regenerating a stream of solitons, the system including:
   an optical waveguide (G) between an input (2) for receiving a stream (S) of solitons to be regenerated and an output (4) at which a stream of regenerated solitons is supplied, the stream of solitons having an input wavelength and a clock rate defining successive clock times of the stream at a bit frequency B of the stream, a segment of the waveguide constituting an interferometer loop (6), the loop being closed by a loop coupler (8) coupling the waveguide to itself at two ends of the loop to constitute a Sagnac interferometer, a mid-point (10) of the loop being at equal distances along the waveguide from the two ends, and a loop amplifier (A) constituted by a semiconductor loop amplifier connected in series in said interferometer loop, the distance along the waveguide between the loop amplifier and the mid-point constituting an offset distance (L), said offset distance (L) being not less than a minimum value which is 20% of a nominal offset LN such that $LN=c/2B$ the offset distance differing by at least this minimum value from illegal values equal to the product of the nominal offset multiplied by an even integer, c being the speed of light in said waveguide, a synchronization source (12) supplying an optical synchronization signal (Y) defining clock times (H1 ... H4) for said stream S of solitons and having a synchronization wavelength and a power varying in accordance with an optical envelope of the signal, the envelope having a frequency equal to half said bit frequency, and means (14) for injecting said synchronization signal (Y) into said loop amplifier (A) to bring about therein cross modulation between said solitons and the synchronization signal, the amplitude and the phase of said envelope of the synchronization signal and an average value of the power of the signal being such that two solitons reaching said input (2) and occupying two immediately successive clock times (H3, H4) of said stream (S) of solitons are transmitted to said output (4) with their optical phase relationship inverted.

2. A system according to claim 1, the system being characterized in that said offset distance (L) is in the range from 80% to 120% of said nominal offset (LN), possibly increased by the product of the nominal offset multiplied by an even integer.

3. A system according to claim 1, the system being characterized in that said modulation of the synchronization signal (Y) is substantially sinusoidal.

4. A system according to claim 1, the system further including a wavelength filter (F) for selectively transmitting light at said input wavelength to said output (4).

5. A system according to claim 1, said synchronization source (12) being controlled by said stream of solitons through the intermediary of a clock recovery coupler (16) and a waveguide (18) constituting a clock recovery unit which has phase matching means (20) to impart to said synchronization signal a phase suitable for said stream of solitons.

6. A system according to claim 1, said stream of solitons constituting a data signal.

7. A method of regenerating a stream of solitons, in which method a stream (S) of solitons enters a Sagnac interferometer (6) with an offset semiconductor amplifier (A) and the amplifier is controlled by an optical synchronization signal (Y) amplitude-modulated at a frequency which is half a bit frequency of the stream, the offset of the amplifier in said interferometer and the parameters of said synchronization signal being such that two adjacent solitons of said stream are transmitted with their optical phase relationship inverted.

* * * * *